(12) United States Patent
Contreras et al.

(10) Patent No.: US 9,717,140 B2
(45) Date of Patent: Jul. 25, 2017

(54) SHIELDED PATTERNED GROUND STRUCTURE FILTER FOR EMI REDUCTION

(71) Applicant: Western Digital Technologies, Inc., San Jose, CA (US)

(72) Inventors: John T. Contreras, Palo Alto, CA (US); Junjia Liu, San Francisco, CA (US); Satoshi Nakamura, Yokohama (JP); Jack Nguyen, San Jose, CA (US); Albert John Wallash, Morgan Hill, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 14/927,405

(22) Filed: Oct. 29, 2015

(65) Prior Publication Data
US 2017/0127509 A1     May 4, 2017

(51) Int. Cl.
| | | |
|---|---|---|
| *H05K 1/02* | (2006.01) | |
| *H01P 7/06* | (2006.01) | |
| *G11B 33/14* | (2006.01) | |
| *G11B 33/12* | (2006.01) | |

(52) U.S. Cl.
CPC ....... *H05K 1/0216* (2013.01); *G11B 33/1493* (2013.01); *H01P 7/065* (2013.01); *G11B 33/122* (2013.01)

(58) Field of Classification Search
None
See application file for complete search history.

(56) References Cited

U.S. PATENT DOCUMENTS

| | | |
|---|---|---|
| 7,459,986 B2 | 12/2008 | Miller |
| 8,659,126 B2 | 2/2014 | Lin et al. |
| 2011/0273245 A1 | 11/2011 | Pai et al. |
| 2013/0271909 A1 | 10/2013 | Chen et al. |
| 2014/0218132 A1 | 8/2014 | Chen |

OTHER PUBLICATIONS

Dr. Mojtaba Joodaki; A New Method for Realization of Common Mode Filter on PCB for EMI Reduction dated Apr. 25, 2007; 1 page.
Wu, et al.; A Novel Wideband Common-Mode Suppression Filter for Gigahertz Differential Signals Using Coupled Patterned Ground Structure; Microwave Theory and Techniques; vol. 57, No. 4 dated Apr. 2009; 1 page.
Patterned Region That Reduces Common Mode Impedance of a Circuit Board dated Feb. 26, 2013; 1 page.

*Primary Examiner* — Craig A. Renner
(74) *Attorney, Agent, or Firm* — Patterson & Sheridan, LLP (57) ABSTRACT

The present disclosure generally relates to a shielded patterned ground structure in a PCB. The PCB may be disposed in a hard disk drive. Conductive traces in PCBs can have the problem of common mode current flowing through the traces and thus increasing the magnitude of EMI noise. By providing a shielded patterned ground structure, the common mode current is reduced as is the magnitude of EMI noise, yet there is no negative impact to the differential signal.

33 Claims, 6 Drawing Sheets

SHIELDED PATTERNED GROUND STRUCTURE FILTER FOR EMI REDUCTION

BACKGROUND OF THE DISCLOSURE

Field of the Disclosure

Embodiments of the present disclosure generally relate to a printed circuit board (PCB) having a shielded patterned ground structure.

Description of the Related Art

The latest generation of hard disk drives utilize PCBs inside of the hard disk drives with silicon on chip (SoC) technology. Traces are used to run the electrical current from the SoC to the edge of the PCB. A common mode current flows through the traces typically and thus generates electromagnetic interference (EMI). The magnitude of the EMI can cause problems for hard disk drive operation at certain frequencies.

To solve the EMI problem, a surface mounted common-mode filter can be used. However, a surface mounted common-mode filter, while correcting EMI, impacts signal integrity and thus is not a viable solution. Another possible solution was to simply change the connection to the PCB, but such a change impacts space requirements and signal integrity. What is needed is a way to deal with the common mode current problem without impacting the signal integrity.

Therefore, there is a need in the art to reduce and/or eliminate common mode current in PCBs which leads to undesirable EMI.

SUMMARY OF THE DISCLOSURE

The present disclosure generally relates to a shielded patterned ground structure in a PCB. The PCB may be disposed in a hard disk drive. Conductive traces in PCBs can have the problem of common mode current flowing through the traces and thus increasing the magnitude of EMI noise. By providing a shielded patterned ground structure, the common mode current is reduced as is the magnitude of EMI noise, yet there is no negative impact to the differential signal.

In one embodiment, a PCB comprises: a first shield layer comprising a first conductive material; a second shield layer that is spaced from the first shield layer, wherein the second shield layer comprises a second conductive material, wherein the second shield layer is spaced from the first shield layer by a first dielectric material, wherein the second shield layer has a first outer portion and a first middle portion, wherein the first middle portion is spaced from the first outer portion on all sides by the first dielectric material when viewed from a top view; at least one conductive trace spaced from the second shield layer such that the second shield layer is disposed between the first shield layer and the at least one conductive trace, wherein the second shield layer is spaced from the at least one conductive trace by a second dielectric material; a first anchor element extending between the first shield layer and the second shield layer, wherein the first anchor element is coupled to both the first shield layer and the second shield layer, wherein the first anchor element is spaced from the at least one conductive trace when viewed in cross-section, wherein the first anchor element extends through the first middle portion of the second shield layer; and a second anchor element extending between the first shield layer and the second shield layer, wherein the second anchor element is coupled to both the first shield layer and the second shield layer, wherein the second anchor element is spaced from the at least one conductive trace when viewed in cross-section, wherein the first anchor element extends through the first middle portion of the second shield layer, and wherein the first anchor element, second anchor element, first shield layer and first middle portion of the second shield layer collectively form a first resonator cavity.

In another embodiment, a hard disk drive comprises a housing; one or more magnetic medias disposed within the housing; and a PCB coupled to the housing. The PCB comprises: a first shield layer comprising a first conductive material; a second shield layer that is spaced from the first shield layer, wherein the second shield layer comprises a second conductive material, wherein the second shield layer is spaced from the first shield layer by a first dielectric material, wherein the second shield layer has a first outer portion and a first middle portion, wherein the first middle portion is spaced from the first outer portion on all sides by the first dielectric material when viewed from a top view; at least one conductive trace spaced from the second shield layer such that the second shield layer is disposed between the first shield layer and the at least one conductive trace, wherein the second shield layer is spaced from the at least one conductive trace by a second dielectric material; a first anchor element extending between the first shield layer and the second shield layer, wherein the first anchor element is coupled to both the first shield layer and the second shield layer, wherein the first anchor element is spaced from the at least one conductive trace when viewed in cross-section, wherein the first anchor element extends through the first middle portion of the second shield layer; and a second anchor element extending between the first shield layer and the second shield layer, wherein the second anchor element is coupled to both the first shield layer and the second shield layer, wherein the second anchor element is spaced from the at least one conductive trace when viewed in cross-section, wherein the first anchor element extends through the first middle portion of the second shield layer, and wherein the first anchor element, second anchor element, first shield layer and first middle portion of the second shield layer collectively form a first resonator cavity.

In another embodiment, a printed circuit board comprises a pair of conductive traces; and a first patterned ground structure disposed below the pair of conductive traces, wherein the first patterned ground structure includes a first shield layer, a second shield layer, a pair of anchor vias, and a first resonator cavity disposed between the first shield layer and the second shield layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a shielded patterned ground structure in a PCB. The PCB may be disposed in a hard disk drive. Conductive traces in PCBs can have the problem of common mode current flowing through the traces and thus increasing the magnitude of EMI noise. By providing a shielded patterned ground structure, the common mode current is reduced as is the magnitude of EMI noise, yet there is no negative impact to the differential signal.

Figure 1:
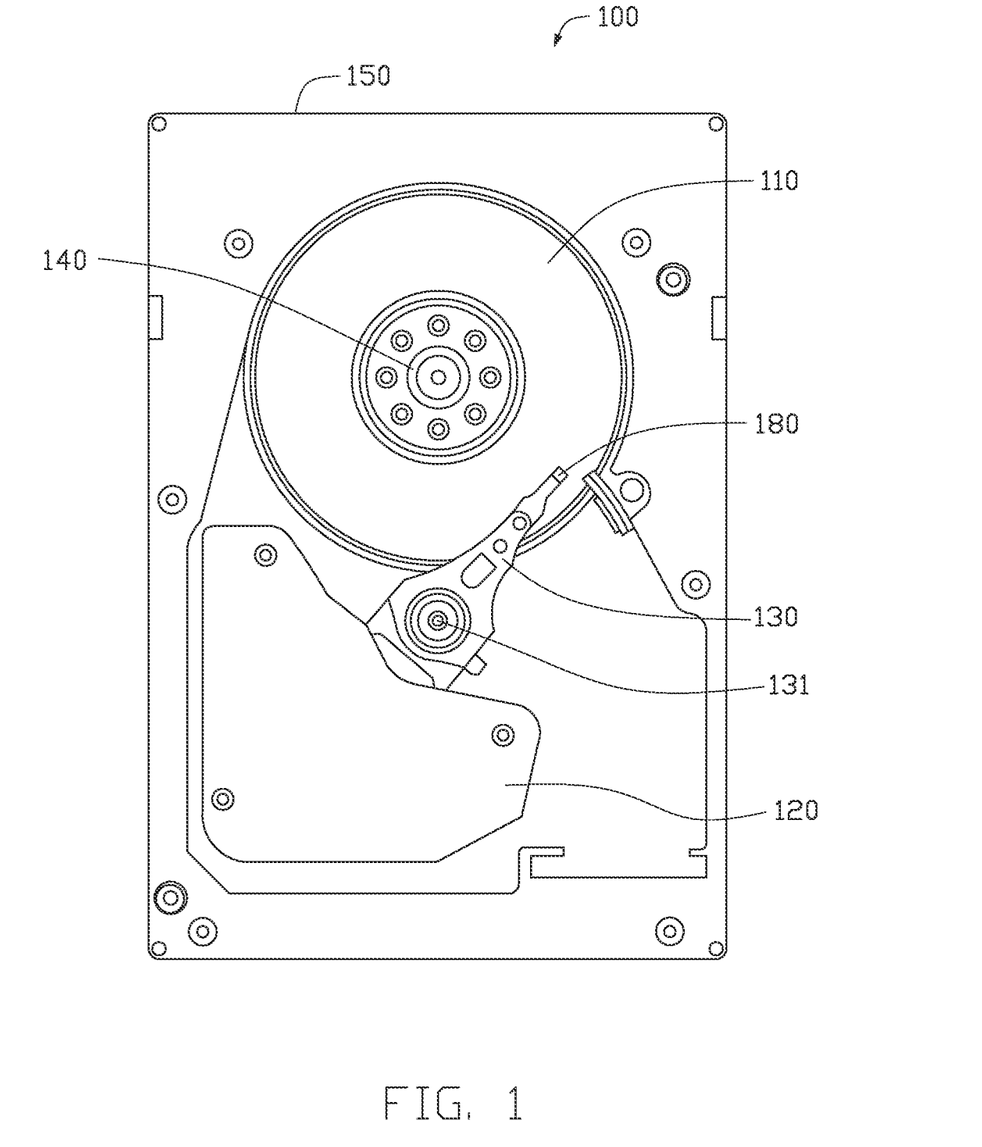
FIG. 1 is a schematic top illustration of a hard disk drive.

FIG. 1 illustrates a top view of an exemplary hard disk drive (HDD) 100, according to an embodiment of the invention. As illustrated, HDD 100 may include one or more magnetic media, or disks 110, actuator 120, actuator arms 130 associated with each of the magnetic disks 110, and spindle motor 140 affixed in a chassis 150. The one or more magnetic disks 110 may be arranged vertically as illustrated in FIG. 1. Moreover, the one or more magnetic disks may be coupled with the spindle motor 140.

Magnetic disks 110 may include circular tracks of data on both the top and bottom surfaces of the disk. A magnetic head 180 mounted on a slider may be positioned on a track. As each disk spins, data may be written on and/or read from the data track. Magnetic head 180 may be coupled to an actuator arm 130 as illustrated in FIG. 1. Actuator arm 130 may be configured to swivel around actuator axis 131 to place magnetic head 180 on a particular data track.

Figure 2:
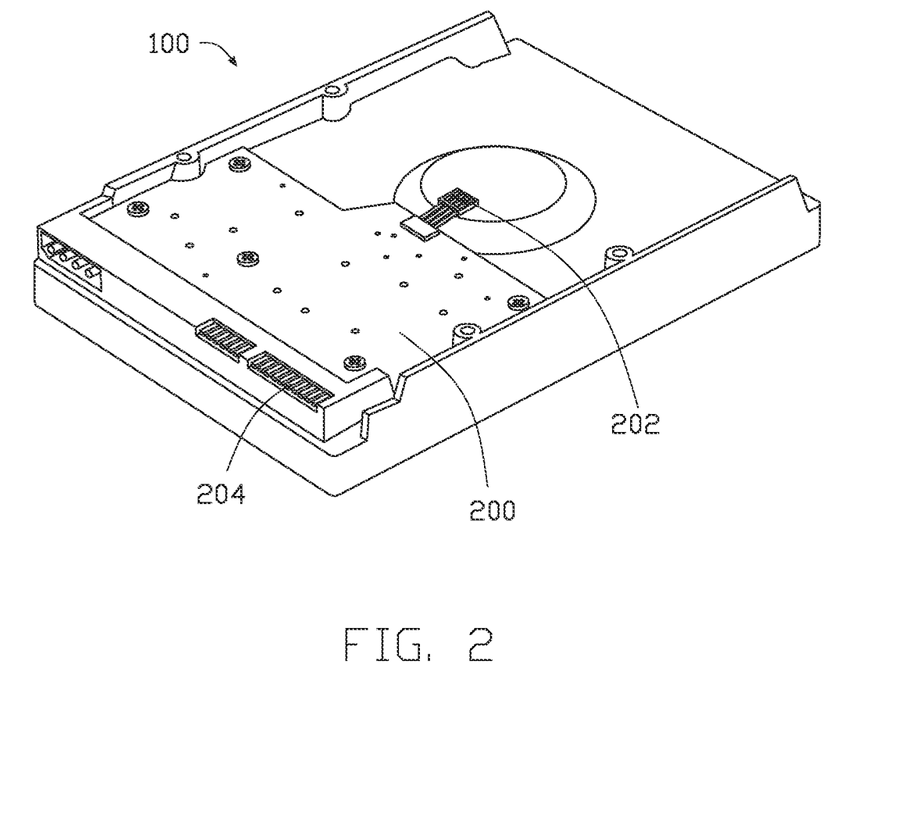
FIG. 2 is a schematic bottom illustration of a hard drive including a PCB.

FIG. 2 is a schematic bottom illustration of a HDD 100 including a PCB 200. The PCB 200 has electrical connections 202 to the HDD 100 and electrical connections 204 to be used to connect to the computer in which the HDD 100 is to be placed.

Figure 3A:
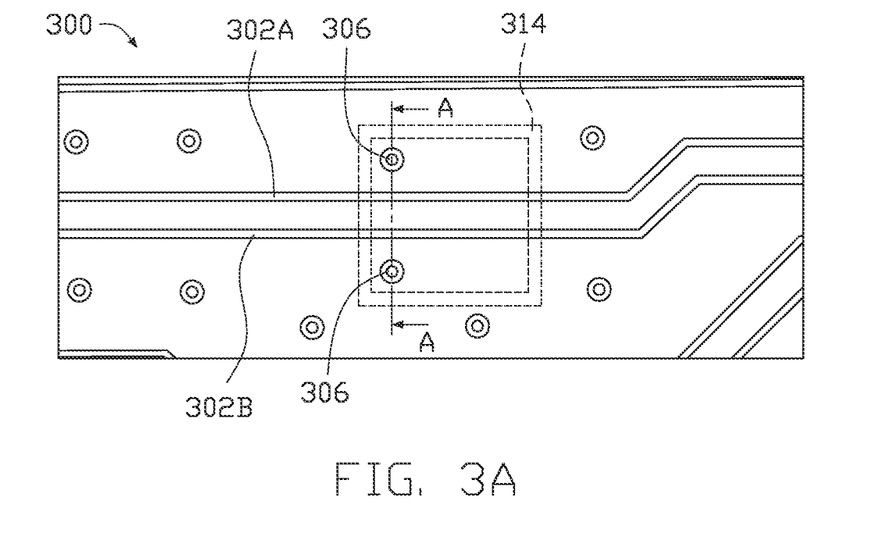
FIG. 3A is a schematic top illustration of a partially unshielded pattern ground structure in a PCB.
Figure 3B:
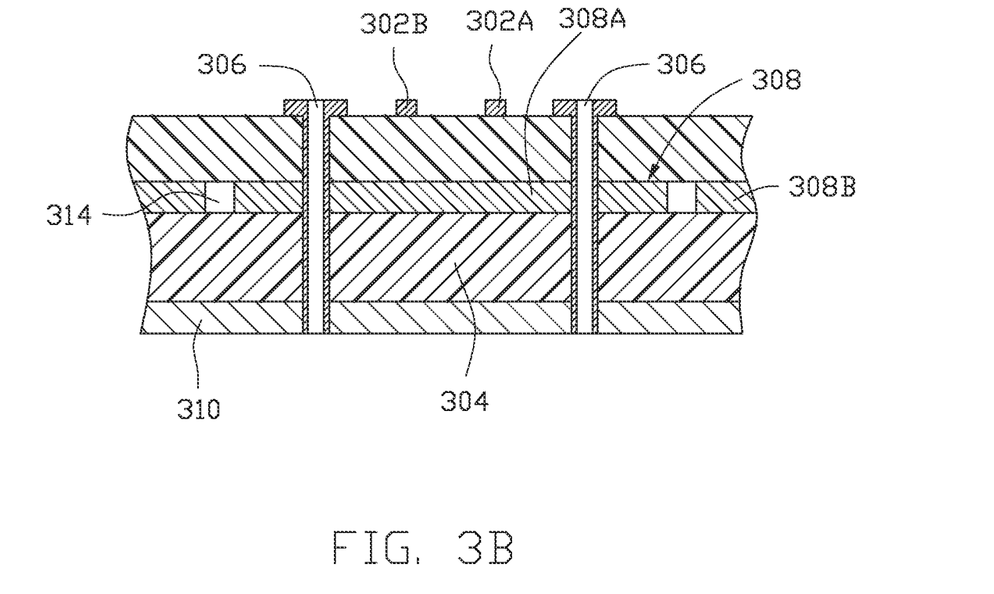
FIG. 3B is a schematic cross-sectional illustration taken along line A-A of FIG. 3A.

FIGS. 3A and 3B are schematic top and cross-sectional illustrations of a partially unshielded pattern ground structure in a PCB 300. Two traces 302A, 302B are shown. The traces 302A, 302B have a common mode signal passing thereon during device operation. The common mode signal is the cause of electromagnetic interference (EMI) detected in HDDs. A resonator cavity 304 can be used to reduce and even eliminate the common mode signal on the traces 302A, 302B. The resonator cavity 304 includes a plurality of anchors elements 306. The resonator cavity 304 is bound by a first shield layer 308 and a second shield layer 310. The first shield layer 308 has a first portion 308A and a second portion 308B spaced apart from the first portion 308 by a gap 314. The gap 314 is in the shape of a rectangle as shown in FIG. 3A, but it is to be understood that the gap 314 may have other shapes as well. The gap 314 is filled with dielectric material and forms the side of a shielding box. The gap 314 is, in essence, stitched into the structure. In the embodiment shown in FIGS. 3A and 3B, the traces 302A, 302B are only shielded on the bottom and thus, there is only one resonator cavity 304 disposed below the traces 302A, 302B. As will be discussed below, a partially shielded PCB, as shown in FIGS. 3A and 3B, may help reduce the common mode signal, but, additional shielding may be beneficial. In the embodiment shown in FIGS. 3A and 3B, an unshielded patterned ground structure (PGS) is shown. As will be shown below, the PGS of FIGS. 3A and 3B may be flipped over on itself to, in essence, create a mirror image resonator cavity so that there is a resonator cavity on both sides of the traces 302A, 302B.

Figure 4A:
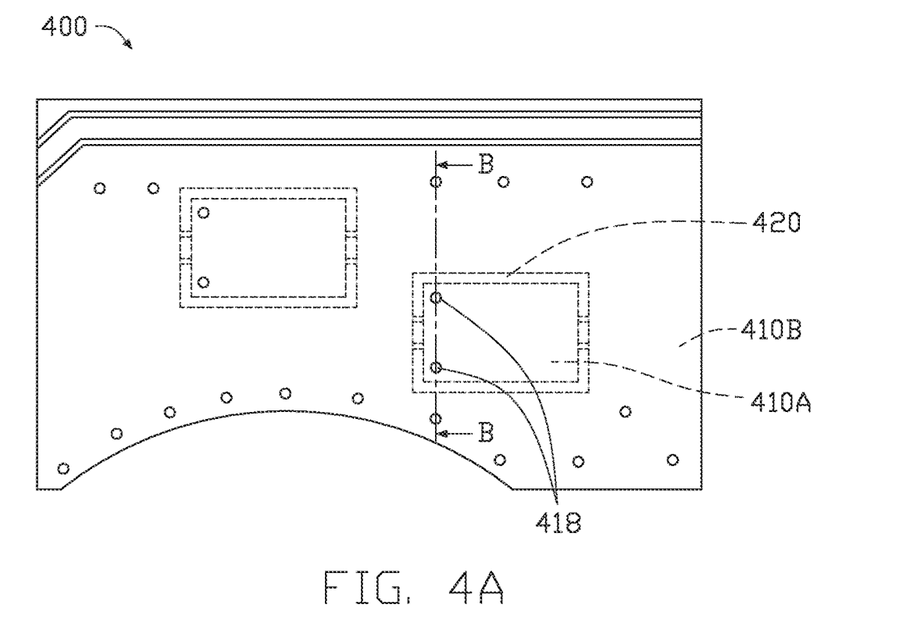
FIG. 4A is a schematic top illustration of a shielded pattern ground structure in a PCB.
Figure 4B:
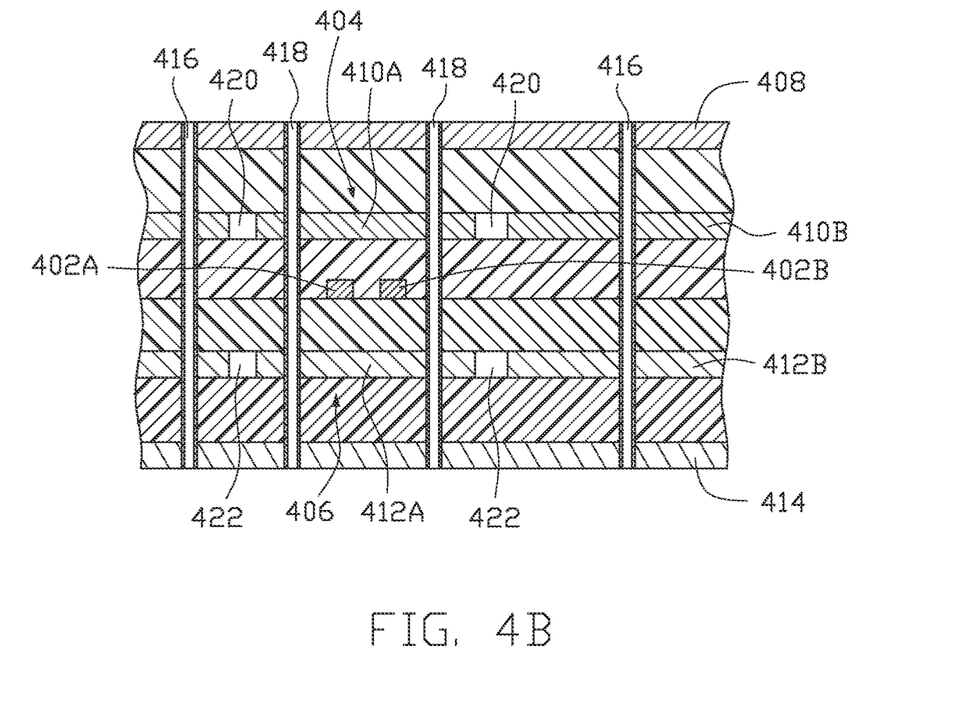
FIG. 4B is a schematic cross-sectional illustration taken along line B-B of FIG. 4A.

FIGS. 4A and 4B are schematic top and cross-sectional illustrations of a shielded pattern ground structure in a PCB 400. The traces 402A, 402B are shielded on both the top and the bottom by resonator cavities 404, 406. The structure includes a first shield 408; a second shield comprising a middle portion 410A and an outer portion 410B; and anchor elements 416 and 418. The middle portion 410A and the outer portion 410B are spaced apart by a gap 420. As discussed above, the gap 420 is filled with a dielectric material and is in the shape of a rectangle as shown in FIG. 4A, but it is to be understood that the gap 420 may have other shapes as well. The gap 420 forms the side of a shielding box. The gap 420 is, in essence, stitched into the structure. In FIG. 4A, the first shield 408 has been removed for clarity. The first shield 408, middle portion 410A and anchor element 418 collectively enclose the top resonator cavity 404. A third shield having a middle portion 412A and an outer portion 412B are also present as is a fourth shield 414. The middle portion 412A, fourth shield 414 and anchor element 418 collectively enclose the bottom resonator cavity 406. The middle portion 412A and outer portion 412B are spaced apart by a gap 422. As discussed above, the gap 422 is filled with a dielectric material and is in the shape of a rectangle as shown in FIG. 4A, but it is to be understood that the gap 422 may have other shapes as well. The gap 422 forms the side of a shielding box. The gap 422 is, in essence, stitched into the structure.

The first shield 408, middle portion 410A, outer portion 410B, middle portion 412A, outer portion 412B and fourth shield 414 may all comprise a conductive material such as copper, tantalum, titanium, tungsten or alloys thereof. In one embodiment, the first shield 408, middle portion 410A, outer portion 410B, middle portion 412A, outer portion 412B and fourth shield 414 all comprise the same material. In another embodiment, at least one of the first shield 408, middle portion 410A, outer portion 410B, middle portion 412A, outer portion 412B and fourth shield 414 comprises a different material compared to the other. The gaps 420, 422 and the areas between the first shield 408, middle portion 410A, outer portion 410B, middle portion 412A, outer portion 412B and fourth shield 414 may comprise an insulating material such as silicon oxide, silicon nitride, silicon oxynitride, or other dielectric material.

The devices shown above all coordinate the common-mode filter and frequency to impact the differential signal transfer. The PGS described herein has little to no impact on the differential signal transfer. The PGS works by having a length (defined as the length of the traces between the bounds of the gaps 314, 420, 422) that is one fourth the common-mode signal wavelength.

In the embodiments shown in FIGS. 3A, 3B, 4A and 4B, single patterned ground structures (PGS) are shown with either a single resonator cavity or two resonator cavities. As will be discussed below, additional structures may be present.

Figure 5A:
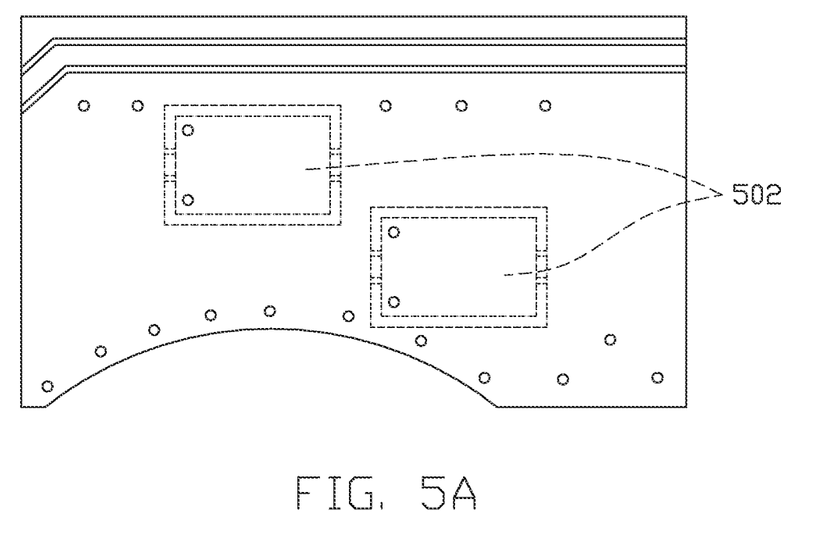
FIGS. 5A-5D are schematic illustrations of a PCB having multiple patterned ground structures according to various embodiments.

FIGS. 5A-5D are schematic illustrations of a PCB having multiple patterned ground structures according to various embodiments. As shown in FIG. 5A, multiple PGS 502 are shown such that each PGS 502 has two traces passing therethrough. In the embodiment shown in FIG. 5A, the PGS 502 are substantially identical. Thus, the PGS 502 of FIG. 5A reduce and/or remove the common mode signal at the same frequency.

Figure 5B:
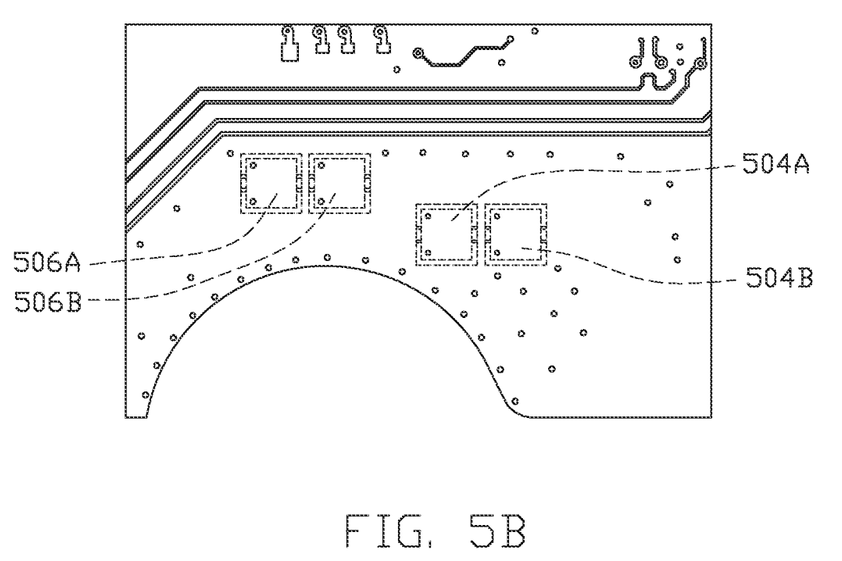

FIG. 5B shows two sets of PGS in which each set has two PGS structures 504A, 504B, 506A, 506B. Two traces pass through each set such that two traces pass through both PGS structures 504A, 504B and two different traces pass through PGS structures 506A, 506B. In the embodiment shown in FIG. 5B, each PGS structure 504A, 504B, 506A, 506B is shown to be substantially identical. FIG. 5B shows that rather than a single PGS, multiple PGS may be used in series to reduce and/or remove the common mode. As will be discussed below, the PGS need not be identical.

Figure 5C:
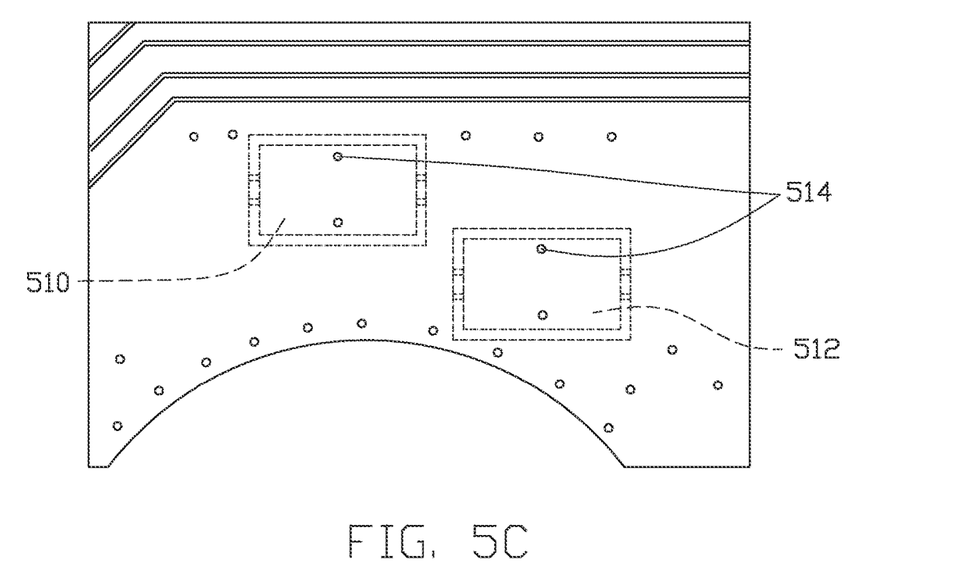

FIG. 5C shows two PGS structures 510, 512 each having anchor elements 514 that are spaced in a different location from that shown in FIGS. 5A and 5B. The location of the anchor elements 514 affects the common mode frequency that may be reduced and/or removed. In the embodiment shown in FIG. 5C, the anchor elements 514 are disposed substantially in the center of the PGS whereas the anchor elements are disposed closer to one end of the PGS in FIGS. 5A and 5B.

Figure 5D:
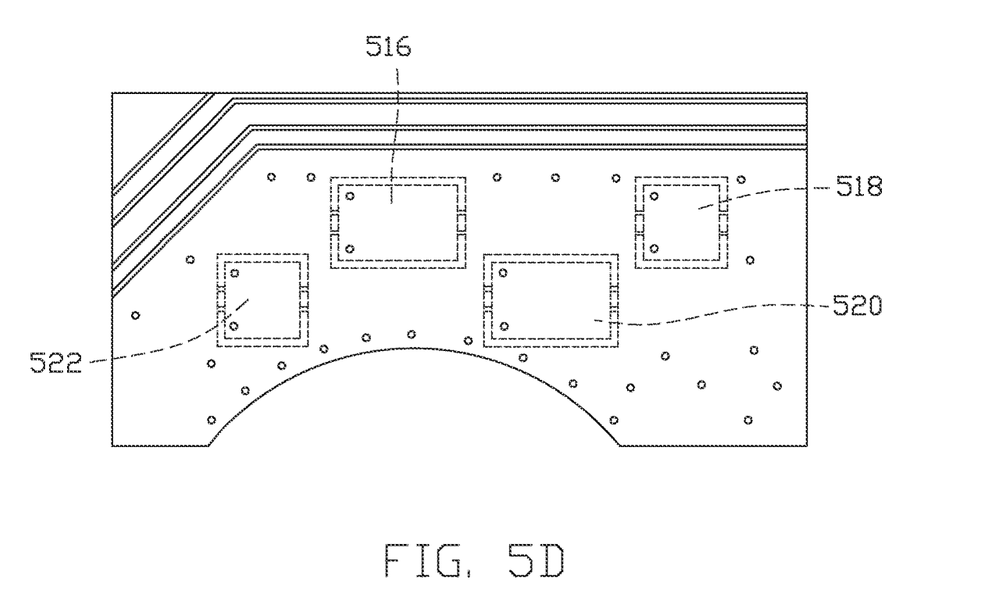

The size (i.e., length and width) of the PGS may also affect the common mode frequency that is reduced and/or removed. FIG. 5D shows four different PGS structures 516, 518, 520, 522. The PGS structures 516, 518, 520, 522 have different lengths and widths. Four total traces pass through the PGS structures 516, 518, 520, 522 such that two traces pass through PGS structures 516, 518 and two different traces pass through PGS structures 520, 522. The different sized PGS structures 516, 518 ensure that two different common mode frequencies are reduced and/or eliminated along the traces that pass therethrough. Similarly, different sized PGS structures 520, 522 ensure that two different common mode frequencies are reduced and/or eliminated along the traces that pass therethrough. It is to be understood that the PGS structure may have different shapes such as "L" shaped and "T" shaped (i.e., non-rectangular). Furthermore, the PGS structures may arranged in series such that the same set of traces passes through multiple PGS structures, for example 4 structures. Additionally, the PGS structures arranged in series may have the same or different shaped gaps 314, 420, 422.

The individual PGS structures can be customized to reduce and/or remove the common mode frequency. For example, a plurality of PGS structures may be positioned along the path that one or more traces follow along the PCB. The PGS structures may be shielded both above and below the traces. The anchor element locations may be customized and thus different in each PGS structure. Additionally, the size (i.e., width and length) of the PGS structures may be customized and thus different. By tailoring the individual PGS structures on the PCB, any desired common mode frequency may be reduced and/or removed based upon: the number of PGS structures, the location of the anchor elements within the PGS structures, the size of the PGS structures, and whether the PGS structures are shielded on both sides or a single side of the one or more traces.

The tailoring may be used to filter out multiple problem frequencies. For example, two PGS structures may be arranged in series to filter out the undesired frequencies for a pair of traces. One of the PGS structures may have a first length while the other PGS structure has a second length that is shorter than the first length. Due to the different lengths, the PGS structures may filter out different frequencies. In another example, the first PGS structure and the second PGS structure may have the same length, but the anchor vias are arranged in different locations. As such, the PGS structures filter different frequencies. In another example, the first and second PGS structures may be completely different in shape, size and anchor via location. It is to be understood that while two PGS structures have been discussed, multiple PGS structures are envisioned. For example, four PGS structures may be arranged in series.

Additionally, the PGS structures may be utilized in multiple layer boards such as 6 layer and 8 layer boards such that multiple PGS structures may be disposed within the PCB.

By utilizing a patterned ground structure that shields the traces, common mode current in PCBs can be reduced and or eliminated. The size of the resonator cavity in the patterned ground structure, as well as the location of the anchor elements, determines the frequency of the common mode current to be reduced and/or eliminated. Thus, based upon the desired frequency to eliminate, the patterned ground structure can be tailored to suit the product's need.

While the foregoing is directed to embodiments of the present disclosure, other and further embodiments of the disclosure may be devised without departing from the basic scope thereof, and the scope thereof is determined by the claims that follow.

What is claimed is:

1. A printed circuit board, comprising:
   a pair of conductive traces; and
   a first patterned ground structure disposed below the pair of conductive traces, wherein the first patterned ground structure includes a first shield layer, a second shield layer, a pair of anchor vias, and a first resonator cavity disposed between the first shield layer and the second shield layer.

2. The printed circuit board of claim 1, further comprising a third shield layer, a fourth shield layer and a second resonator cavity disposed between the first shield layer and the second shield layer, wherein the third shield layer, fourth shield layer and second resonator cavity is disposed over the pair of conductive traces.

3. The printed circuit board of claim 1, wherein the second shield layer includes a first portion and a second portion spaced from the first portion by a gap that is filled with dielectric material, wherein the gap creates a shielding box.

4. The printed circuit board of claim 1, further comprising a second patterned ground structure disposed in series with the first patterned ground structure.

5. The printed circuit board of claim 1, wherein the patterned ground structure has a length that is one fourth a common-mode wavelength of the pair of conductive traces.

6. A printed circuit board, comprising:
- a first shield layer comprising a first conductive material;
- a second shield layer that is spaced from the first shield layer, wherein the second shield layer comprises a second conductive material, wherein the second shield layer is spaced from the first shield layer by a first dielectric material, wherein the second shield layer has a first outer portion and a first middle portion, wherein the first middle portion is spaced from the first outer portion on all sides by the first dielectric material when viewed from a top view;
- at least one conductive trace spaced from the second shield layer such that the second shield layer is disposed between the first shield layer and the at least one conductive trace, wherein the second shield layer is spaced from the at least one conductive trace by a second dielectric material;
- a first anchor element extending between the first shield layer and the second shield layer, wherein the first anchor element is coupled to both the first shield layer and the second shield layer, wherein the first anchor element is spaced from the at least one conductive trace when viewed in cross-section, wherein the first anchor element extends through the first middle portion of the second shield layer; and
- a second anchor element extending between the first shield layer and the second shield layer, wherein the second anchor element is coupled to both the first shield layer and the second shield layer, wherein the second anchor element is spaced from the at least one conductive trace when viewed in cross-section, wherein the second anchor element extends through the first middle portion of the second shield layer, and wherein the first anchor element, second anchor element, first shield layer and first middle portion of the second shield layer collectively form a first resonator cavity.

7. The printed circuit board of claim 6, wherein the at least one trace comprises two traces.

8. The printed circuit board of claim 6, further comprising:
- a third shield layer that is spaced from the at least one trace, wherein the third shield layer comprises a third conductive material, wherein the third shield layer is spaced from the at least one trace by a third dielectric material, wherein the third shield layer has a second outer portion and a second middle portion, wherein the second middle portion is spaced from the second outer portion on all sides by the third dielectric material when viewed from a top view; and
- a fourth shield layer that is spaced from the third shield layer, wherein the fourth shield layer comprises a fourth conductive material, wherein the first anchor element extends through the second middle portion of the third shield layer, and wherein the first anchor element, second anchor element, third shield layer and fourth shield layer collectively form a second resonator cavity.

9. The printed circuit board of claim 8, wherein the second shield layer further comprises a third middle portion that is spaced from the first outer portion on all sides by the first dielectric material, wherein the third shield layer further comprises a fourth middle portion that is spaced from the second outer portion on all sides by the third dielectric material.

10. The printed circuit board of claim 9, further comprising a third anchor element and a fourth anchor element, wherein the third anchor element and the fourth anchor element both extend through the third middle portion and the first shield layer, wherein the third anchor element, the fourth anchor element, the third middle portion and the first shield layer collectively form a third resonator cavity, wherein the third anchor element and the fourth anchor element extend through the fourth middle portion and the fourth shield layer, and wherein the third anchor element, the fourth anchor element, the fourth middle portion and the fourth shield layer collectively form a fourth resonator cavity.

11. The printed circuit board of claim 10, wherein the third resonator cavity has a different size compared to the first resonator cavity.

12. The printed circuit board of claim 10, wherein the third resonator cavity has the same size as the first resonator cavity.

13. The printed circuit board of claim 10, wherein the first anchor element is spaced a first distance from an edge of the first middle portion, wherein the third anchor element is spaced a second distance from an edge of the third middle portion, and wherein the first distance is greater than the second distance.

14. The printed circuit board of claim 10, wherein the first anchor element is spaced a first distance from an edge of the first middle portion, wherein the third anchor element is spaced a second distance from an edge of the third middle portion, and wherein the first distance is equal to the second distance.

15. The printed circuit board of claim 6, wherein the second shield layer further comprises a third middle portion that is spaced from the first outer portion on all sides by the first dielectric material.

16. The printed circuit board of claim 15, further comprising a third anchor element and a fourth anchor element, wherein the third anchor element, the fourth anchor element, the third middle portion and the first shield layer collectively form a third resonator cavity wherein the third anchor element and the fourth anchor element both extend through the third middle portion and the first shield layer.

17. The printed circuit board of claim 16, wherein the first middle portion and the third middle portion have different sizes such that the first resonator cavity and the third resonator cavity are sized different.

18. The printed circuit board of claim 17, wherein the first anchor element is spaced a first distance from an edge of the first middle portion, wherein the third anchor element is spaced a second distance from an edge of the third middle portion, and wherein the first distance is the same as the second distance.

19. The printed circuit board of claim 17, wherein the first anchor element is spaced a first distance from an edge of the first middle portion, wherein the third anchor element is spaced a second distance from an edge of the third middle portion, and wherein the first distance and the second distance are different.

20. A hard disk drive, comprising:
- a housing;
- one or more magnetic medias disposed within the housing; and
- a printed circuit board coupled to the housing, wherein the printed circuit board comprises:

a first shield layer comprising a first conductive material;

a second shield layer that is spaced from the first shield layer, wherein the second shield layer comprises a second conductive material, wherein the second shield layer is spaced from the first shield layer by a first dielectric material, wherein the second shield layer has a first outer portion and a first middle portion, wherein the first middle portion is spaced from the first outer portion on all sides by the first dielectric material when viewed from a top view;

at least one conductive trace spaced from the second shield layer such that the second shield layer is disposed between the first shield layer and the at least one conductive trace, wherein the second shield layer is spaced from the at least one conductive trace by a second dielectric material;

a first anchor element extending between the first shield layer and the second shield layer, wherein the first anchor element is coupled to both the first shield layer and the second shield layer, wherein the first anchor element is spaced from the at least one conductive trace when viewed in cross-section, wherein the first anchor element extends through the first middle portion of the second shield layer; and a second anchor element extending between the first shield layer and the second shield layer, wherein the second anchor element is coupled to both the first shield layer and the second shield layer, wherein the second anchor element is spaced from the at least one conductive trace when viewed in cross-section, wherein the second anchor element extends through the first middle portion of the second shield layer, and wherein the first anchor element, second anchor element, first shield layer and first middle portion of the second shield layer collectively form a first resonator cavity.

21. The hard disk drive of claim 20, wherein the at least one trace comprises two traces.

22. The hard disk drive of claim 20, further comprising:
a third shield layer that is spaced from the at least one trace, wherein the third shield layer comprises a third conductive material, wherein the third shield layer is spaced from the at least one trace by a third dielectric material, wherein the third shield layer has a second outer portion and a second middle portion, wherein the second middle portion is spaced from the second outer portion on all sides by the third dielectric material when viewed from a top view; and a fourth shield layer that is spaced from the third shield layer, wherein the fourth shield layer comprises a fourth conductive material, wherein the first anchor element extends through the second middle portion of the third shield layer, and wherein the first anchor element, second anchor element, third shield layer and fourth shield layer collectively form a second resonator cavity.

23. The hard disk drive of claim 22, wherein the second shield layer further comprises a third middle portion that is spaced from the first outer portion on all sides by the first dielectric material, wherein the third shield layer further comprises a fourth middle portion that is spaced from the second outer portion on all sides by the third dielectric material.

24. The hard disk drive of claim 23, further comprising a third anchor element and a fourth anchor element, wherein the third anchor element and the fourth anchor element both extend through the third middle portion and the first shield layer, wherein the third anchor element, the fourth anchor element, the third middle portion and the first shield layer collectively form a third resonator cavity, wherein the third anchor element and the fourth anchor element extend through the fourth middle portion and the fourth shield layer, and wherein the third anchor element, the fourth anchor element, the fourth middle portion and the fourth shield layer collectively form a fourth resonator cavity.

25. The hard disk drive of claim 24, wherein the third resonator cavity has a different size compared to the first resonator cavity.

26. The hard disk drive of claim 24, wherein the third resonator cavity has the same size as the first resonator cavity.

27. The hard disk drive of claim 24, wherein the first anchor element is spaced a first distance from an edge of the first middle portion, wherein the third anchor element is spaced a second distance from an edge of the third middle portion, and wherein the first distance is greater than the second distance.

28. The hard disk drive of claim 24, wherein the first anchor element is spaced a first distance from an edge of the first middle portion, wherein the third anchor element is spaced a second distance from an edge of the third middle portion, and wherein the first distance is equal to the second distance.

29. The hard disk drive of claim 20, wherein the second shield layer further comprises a third middle portion that is spaced from the first outer portion on all sides by the first dielectric material.

30. The hard disk drive of claim 29, further comprising a third anchor element and a fourth anchor element, wherein the third anchor element, the fourth anchor element, the third middle portion and the first shield layer collectively form a third resonator cavity wherein the third anchor element and the fourth anchor element both extend through the third middle portion and the first shield layer.

31. The hard disk drive of claim 30, wherein the first middle portion and the third middle portion have different sizes such that the first resonator cavity and the third resonator cavity are sized different.

32. The hard disk drive of claim 30, wherein the first anchor element is spaced a first distance from an edge of the first middle portion, wherein the third anchor element is spaced a second distance from an edge of the third middle portion, and wherein the first distance is the same as the second distance.

33. The hard disk drive of claim 30, wherein the first anchor element is spaced a first distance from an edge of the first middle portion, wherein the third anchor element is spaced a second distance from an edge of the third middle portion, and wherein the first distance and the second distance are different.

\* \* \* \* \*